United States Patent
Hildenbrand et al.

(10) Patent No.: US 8,138,671 B2
(45) Date of Patent: Mar. 20, 2012

(54) COLOR-STABLE PHOSPHOR CONVERTED LED

(75) Inventors: Volker Dirk Hildenbrand, Eindhoven (NL); Virginie Mercier, Eindhoven (NL); Rene Jan Hendriks, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 197 days.

(21) Appl. No.: 12/298,966

(22) PCT Filed: Apr. 26, 2007

(86) PCT No.: PCT/IB2007/051553
§ 371 (c)(1),
(2), (4) Date: Oct. 29, 2008

(87) PCT Pub. No.: WO2007/125493
PCT Pub. Date: Nov. 8, 2007

(65) Prior Publication Data
US 2009/0128028 A1    May 21, 2009

(30) Foreign Application Priority Data
May 2, 2006   (EP) .................................. 06113391

(51) Int. Cl.
*H01L 51/50*   (2006.01)
*H01L 51/52*   (2006.01)
(52) U.S. Cl. ............ 313/506; 313/498; 445/23; 445/24; 445/25
(58) Field of Classification Search .......... 313/483–512; 427/219; 430/7
See application file for complete search history.

(56) References Cited

U.S. PATENT DOCUMENTS

| | | | |
|---|---|---|---|
| 5,376,172 A * | 12/1994 | Tripp et al. .................... | 106/490 |
| 5,728,758 A | 3/1998 | Smith | |
| 6,642,652 B2 | 11/2003 | Collins, III et al. | |
| 6,756,731 B1 | 6/2004 | Sano | |
| 2002/0043926 A1 | 4/2002 | Takahashi et al. | |
| 2002/0180351 A1* | 12/2002 | McNulty et al. .............. | 313/512 |
| 2002/0185965 A1* | 12/2002 | Collins et al. .................. | 313/501 |
| 2004/0061433 A1 | 4/2004 | Izuno et al. | |
| 2004/0159849 A1 | 8/2004 | Negley | |
| 2005/0022697 A1* | 2/2005 | Benrashid et al. ....... | 106/287.13 |
| 2005/0231953 A1 | 10/2005 | Reeh et al. | |

FOREIGN PATENT DOCUMENTS

| | | | |
|---|---|---|---|
| DE | 10316769 A1 | 10/2004 | |
| EP | 1146093 A1 | 10/2001 | |
| EP | 1164005 A1 | 12/2001 | |
| EP | 1403934 A2 * | 3/2004 | |
| GB | 1041083 A | 9/1966 | |
| WO | 0039203 A2 | 7/2000 | |
| WO | 0055914 A1 | 9/2000 | |
| WO | 02089175 A1 | 11/2002 | |

* cited by examiner

*Primary Examiner* — Joseph L Williams
*Assistant Examiner* — Nathaniel Lee (57) ABSTRACT

A light-emitting device is provided, comprising at least one light-emitting diode (100) for emitting light of a first color and a luminescent material (102) arranged on said at least one light-emitting diode to receive at least part of the light emitted by said light-emitting diode. The light-emitting device further comprises a filter (103) arranged to receive light emitted by said light-emitting diode (100) and transmitted through said luminescent material (102) and to absorb light of said first color. The filter comprises a pigment compound distributed in a matrix of silicon and oxygen atoms, in which matrix at least a portion of said silicon atoms are directly bonded to hydrocarbon groups.

24 Claims, 4 Drawing Sheets

COLOR-STABLE PHOSPHOR CONVERTED LED

The present invention relates to a light-emitting device, comprising at least one light-emitting diode for emitting light of a first color and a luminescent material arranged on said at least one light-emitting diode to receive at least part of the light emitted by said light-emitting diode. The present invention further relates to methods for the manufacture of such a device.

LEDs (Light-Emitting Diode) are currently considered for application in several aspects of lighting, for instance general ambient lighting, signal lighting, such as traffic lights, automotive lighting, such as brake lights and the like, and in display device lighting, such as in backlights for LCD-displays.

LEDs are currently available in different colors, from UV-diodes, via the visible range, to IR-diodes. Problems with in particular red and amber LEDs are the strong temperature dependence of the light output and the color point, respectively. The light output as function of the junction temperature is different for red, amber, green, and blue LEDs. This effect limits the power density and increases the sensitivity to ambient temperature variations, in particular, in rear lights and blinking indicators of cars.

To partly overcome this temperature dependence, so called phosphor converted LEDs have been proposed, i.e. light-emitting diodes being provided with a phosphor compound (i.e. a luminescent compound), which absorbs the light of the diode and converts it to a different color. For example, a blue diode may be provided with a red phosphor, which absorbs at least part of the blue light and consequently, emits red light.

The temperature dependence of phosphor-converted blue and purple, and UV diodes is less but particularly the color point and the correlated color temperature depend strongly on the layer thickness of the phosphor used. Small layer thickness variations on the LED may even lead to viewing angle dependent color point variations. In addition, a problem with phosphor converted blue and particularly UV-LEDs is that it is very difficult to reduce the blue and UV-leak through the phosphor layer. The blue and UV leaking radiation further degrades the matrix material of the phosphors and surrounding silicone and plastic packaging components.

One approach to an improved phosphor-converted light-emitting diode is described in US patent application 2004/0061433 to Izuno et al, where the phosphor compound is contained in a sol gel-based matrix. The therein-proposed approach allegedly overcomes the problems with the thickness variations.

However, a remaining disadvantage of phosphor-converted LED is that thick phosphor layers of tens or even hundreds of microns are required to get a high saturation of the emitted color or prevent a high leakage of UV or blue light. Thick layers of phosphor increase the reflection of light back to the chip and the effective path length of light in the phosphor LED combination, which means that the efficacy decreases.

Further, another disadvantage of the sol gel-based matrix described in US patent application 2004/0061433 is that it is rather inflexible in combination with that its thermal expansion coefficient is drastically different from the thermal expansion coefficient of typical LEDs. When operating, LEDs dissipates heat, leading to a thermal expansion of the LED-structure. This leads to that the interface between the LED and the phosphor layer is subjected to stress forces, and a risk for peeling of the phosphor layer is imminent. Moreover, because of the lack of flexibility in the sol-gel based matrix according to the prior art, cracks inside the sol-gel bonded phosphor layer can occur, leading to fatigue. If the porosity of the layer is so high that thermal stresses are not build-up or overcome by moving of phosphor particles, the mechanical stability of the layer is not sufficient and the interface is not well defined and smooth.

Thus, there exists a need for improved light-emitting diodes having a color point, which is less dependent on the thickness of the phosphor layer.

There also exists a need for improved light-emitting diodes allowing high color saturation from thinner phosphor layers.

One object of the present invention is to overcome at least one of the above-mentioned drawbacks of the prior art, and to provide a light-emitting device comprising at least one phosphor converted LED that has a color point, which is not as dependent on the thickness of the phosphor layer as in conventional phosphor converted LEDs, and which allows high color saturation from thin phosphor layers.

The present inventors have found that this object may be achieved by arranging a filter on a phosphor-converted light-emitting diode. The filter is arranged to receive light emitted by the light emitted diode and transmitted through the phosphor material, and to absorb light of the color emitted by the light-emitting diode. This filter is arranged between the light-emitting diode and a viewer.

As a result, the light, which was not converted by the phosphor material, is absorbed in the filter material, whereas the light converted by the phosphor material is not absorbed in the filter material, but transmitted essentially unaffected through the filter material.

Due to this, the color point of the total light from the diode (i.e. the combination of the unconverted light and the converted light) will become less dependent on the thickness of the phosphor layer, and a thinner phosphor layer may be used while still obtaining light of a more saturated converted color.

Further, the filter material is selected to be a pigment compound distributed in a matrix comprising silicon and carbon atoms, wherein at least a portion of the silicon atoms in the matrix is directly bonded to a hydrocarbon group. Such a material is a rather flexible material and is thus less prone to peeling and cracking when the temperature of the light-emitting diode is changing.

Thus, in a first aspect the present invention relates to a light-emitting device comprising at least one light-emitting diode for emitting light of a first color and a luminescent material arranged on said at least one light-emitting diode to receive at least part of the light emitted by said light-emitting diode. The light-emitting device further comprises a filter arranged to receive light emitted by said light-emitting diode and transmitted through said luminescent material and absorbing light of said first color. The filter comprises a pigment compound distributed in a matrix of silicon and oxygen atoms, in which matrix at least a portion of said silicon atoms are directly bonded to hydrocarbon groups.

Typically, the first light of the first color is blue or UV-light.

Typically, in the range of 10 to 95% of said silicon atoms are directly bonded to hydrocarbon groups, in order to yield a matrix having the desired elasticity, porosity and capability to hold pigment compound.

The hydrocarbon groups directly bonded to the silicon atoms are typically selected from among alkyls and aryls, preferably from methyl, ethyl and phenyl. The choice of hydrocarbon group influences for example on the refractive index of the matrix.

The matrix is typically the result from polymerizing a composition comprising alkyl- or aryl-trialkoxysilanes, such as -trimethoxysilane and -triethoxysilane. The result from such a polymerization reaction is a porous matrix having a good capacity of holding pigment compound and having a desired elasticity.

In order to increase the elasticity module of the matrix, the composition to be polymerized may further comprises tetraalkoxysilane.

In embodiments of the present invention, the pigment compound is in the form of particles having a mean particle diameter of less than 250 nm. At such particle sizes, the pigment compounds are only slightly scattering or even transparent to light of wavelengths not absorbed by the pigments. Examples of pigment compounds include noble metal colloid particles, inorganic pigments, organic pigments, and any combinations of two or more thereof.

In embodiments of the present invention, the filter further comprises filler material particles, which may be used to increase the thickness of the filter layer.

In some embodiments of the present invention, the filter is arranged on top of said luminescent material on the LED. In other embodiments of the present invention, the device further comprises an optical element arranged to receive light emitted by said light-emitting diode, wherein said filter is arranged on said optical element.

In a second aspect, the present invention provides a method for the manufacture of a light-emitting device, comprising: providing at least one light-emitting diode for emitting light of a first color, on which light-emitting diode a luminescent material is arranged to receive at least part of the light emitted by said light-emitting diode; and arranging, on said luminescent material, a filter by arranging and polymerizing a polymerizable composition on said luminescent material, which polymerizable composition comprises at least an organically modified silane having the general formula $R^1$-trialkoxysilane and a pigment compound in a liquid medium, wherein $R^1$ is selected from the group consisting of aryls and alkyls, and wherein said pigment compound absorbs light of said first color.

Alternatively, the second aspect of the present invention may also provide a method for the manufacture of a light-emitting device, comprising providing at least one light-emitting diode for emitting light of a first color, on which light-emitting diode a luminescent material is arranged to receive at least part of the light emitted by said light-emitting diode; providing an optical element; arranging, on said optical element, a filter by arranging and polymerizing a composition on said optical element, which composition comprises at least an organically modified silane having the general formula $R^1$-trialkoxysilane and a pigment compound in a liquid medium, wherein $R^1$ is selected from the group consisting of aryls and alkyls, and wherein said pigment compound absorbs light of said first color; arranging said optical element such that said filter receives light emitted by said light-emitting diode and transmitted through said luminescent material.

These and other aspects and advantages of the present invention will be apparent from the following detailed description of the invention together with the following illustrative drawings.

As defined herein, the term "light-emitting diode" (abbreviated "LED"), refers to any type of light-emitting diodes known to those skilled in the art, such as, but not limited to inorganic based LEDs, polymeric based LEDs (polyLED), small organic molecule based LEDs (smOLEDs), etc. In addition, laser-emitting diodes are encompassed by the term "light-emitting diodes"

For the purposes of the present invention, the LED may in principle be adapted to emit light of any color, from ultraviolet (UV) light, over visible light, to infrared (IR) light.

Figure 1:
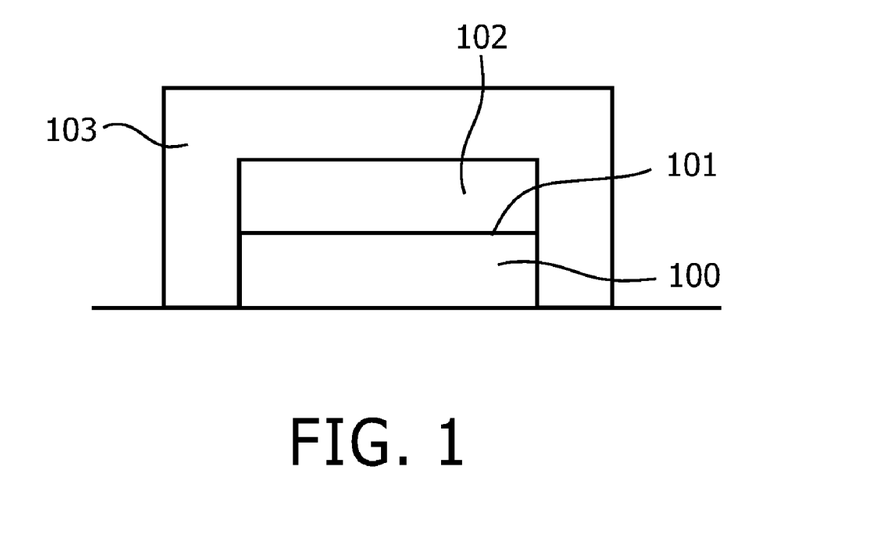
FIG. 1 schematically illustrates, in cross-sectional view, a light-emitting device according to a first embodiment of the present invention.

A first exemplary embodiment is schematically illustrated in FIG. 1, showing a light-emitting device of the present invention comprising a light-emitting diode 100 having a light-emitting surface 101 (i.e. a surface through which light produced in the diode exits the diode). In operation, the LED 100 emits light of a first wavelength or wavelength interval (i.e. color). For the purposes of the present invention, this light will be referred to as the "pump-light", thus having a "pump-wavelength range" or "pump-color".

On the light-emitting surface is arranged a luminescent material 102 (also called a phosphor layer). The object of the luminescent material 102 is to receive at least part of the light emitted through the light-emitting surface 101 (pump-light), and to convert at least part of the pump light into a converted light of a higher wavelength.

As used herein, the term "luminescence" refers to both fluorescence and phosphorescence, i.e. photon emission due to relaxation of excited electrons.

On top of the phosphor layer 102 is arranged a filter 103. The object of this filter layer 103 is to receive at least part of the converted light emitted by the phosphor layer 102 and at least part of the pump-light from the diode 100, which is transmitted unconverted through the phosphor layer 102.

The main object of this filter 103 is to absorb at least part of the pump-light, while the converted light is essentially transmitted through the filter 103.

As a consequence, the total light from the device, i.e. the sum of light after the filter 103 has a high content of the converted light and low content of the pump-light, even when the phosphor layer is thin.

Figure 2:
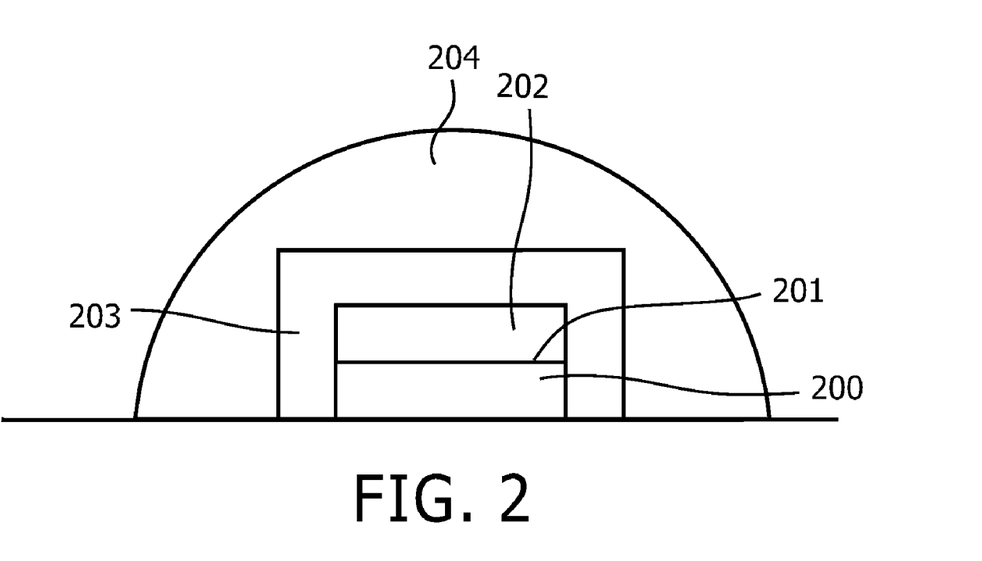
FIG. 2 schematically illustrates, in cross-sectional view, a light-emitting device according to a second embodiment of the present invention.

A second embodiment of a light-emitting device, schematically illustrated in FIG. 2, comprises a light-emitting diode 200 having a light-emitting surface 201, and a luminescent material (phosphor layer) 202 arranged to receive at least part of the light emitted by the LED 200.

A filter 203 is arranged on an optical element 204 (here depicted as a convex lens by way of example). The filter 203 and the optical element 204 are arranged such that the filter is located in at least part of the ray path between the phosphor layer 202 and the optical element 204.

Figure 3:
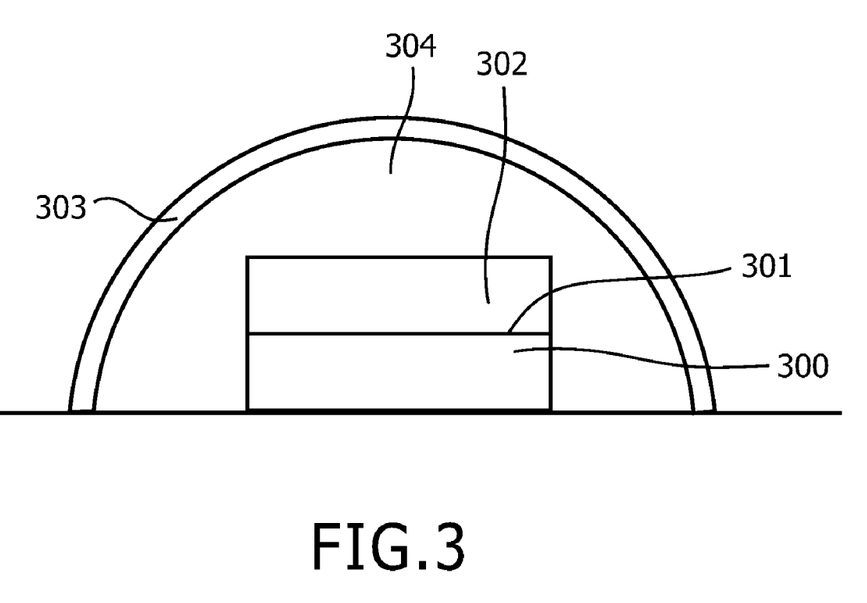
FIG. 3 schematically illustrates, in cross-sectional view, a light-emitting device according to a third embodiment of the present invention.

A third embodiment of a light-emitting device, schematically illustrated in FIG. 3, comprises a light-emitting diode 300 having a light-emitting surface 301, and a luminescent material (phosphor layer) 302 arranged to receive at least part of the light emitted by the LED 300.

A filter 303 is arranged on an optical element 304 (here depicted as a convex lens by way of example). The filter 303 and the optical element 304 are arranged such that the optical lens is located in at least part of the ray path between the phosphor layer 302 and the filter 303. Hence, the filter material is located on top of the optical element, on a surface thereof distant to the light-emitting diode.

The LED (100; 200; 300) is typically a LED emitting light in the UV or visible range. Preferably, the LED is a UV, blue or green LED, depending on the application and on the desired total color.

The luminescent material (102; 202; 302) may be any luminescent material known to those skilled in the art. Typically, the luminescent material has a high absorption coefficient for wavelengths at or near the emission wavelength peak for the pump-light, so that high intensities of light may be absorbed by the luminescent materials even at low concentrations.

Further, the luminescence quantum yield of the luminescent material is high (i.e. the ratio between absorbed pump light and emitted converted light), allowing an efficient conversion of pump-light in the luminescent material.

Luminescent compounds (phosphors) suitable for use in a light-emitting device of the present invention depends on the pump-color and on the desired color of the converted light and include, but are not limited to: yellow light emitting phosphors, such as e.g. YAG:Ce and $(Sr, Ca)_2SiO_4:Eu$; red light emitting phosphors, such as e.g. $(Sr, Ba)_2Si_5N_8:Eu$, $(Gd, La, Y)_2O_2S:Bi, Eu$, $(Ca, Sr)S:Eu, YVO4:Eu, Bi$; green light emitting phosphors, such as e.g. $Sr_2Si_2N_2O_2:Eu$, LuAG:Ce, $(Ba, Sr)_2SiO_4:Eu$.

The phosphors may be used alone or in mixtures of two or more such phosphors can be used so that red, green, or amber converted colors can be made.

The luminescent material is typically in the form of particles of luminescent (phosphor) compound, optionally distributed in a carrier material. Examples of such carrier materials include silicon-carbon matrices, for example sol-gel materials or condensation silicones or addition-cured silicones. One preferred carrier material suitable for use in the present invention is the type of silicon-carbon matrix that will be described later as the matrix for the filter. This matrix allow to accommodate stresses and is relatively unaffected by UV or blue light and temperature over the application lifetime.

Methods for the providing light-emitting diodes with luminescent materials are well known in the art, such as via spraying, dispensing, and blade coating using appropriate masks.

The filter (103; 203; 303) is arranged in the ray path between the luminescent material and a potential viewer of the light-emitting device. The main properties for the filter is that it should (i) have high absorption coefficient for light of the pump-color, while being essentially non-luminescent (i.e. absorbing the pump light without any emission of light as a consequence thereof); and (ii) a high transmission coefficient for light of the converted color.

As a result, the converted light contributes to a larger part to the total light than it would without the filter layer, and the total light is thus more saturated with converted light. Consequently, the leakage of the pump-light is strongly reduced independently of the spatial light distribution.

The result is also a light-emitting device where the thickness and/or concentration of the luminescent layer do not influence the color point of the total light to the same extension as a light-emitting device without a filter layer.

The filter material comprises of a pigment compound distributed in a matrix.

Pigment compounds suitable for use in the present invention include, but are not limited to:

noble metal colloids, such as Au and Ag colloids; inorganic pigments, such as metal oxides, such as oxides of Fe, Zn, Ti, Sb, Cr, Co, Bi and/or V, for example $Fe_2O_3$ (PR 101), FeOOH (PY 42), P-doped $Fe_2O_3$, $ZnFe_2O_4$ (PB 119), (Fe, Zn, Cr) oxide (PB 33), (Ti, Sb, Cr) oxide (PB 24), $BiVO_4$ (PY 184), (Zr, Si, Fe) oxide (PR 232), (Co, Al, Cr, Ti) oxide (PG 26), (Ti, Zn, Co, Ni) oxide (PG 50), and metal oxynitrides, such as oxynitrides of one or more of metals selected from among Mg, Ca, Fe, Mn, Co, Ni, In, Cr, Sr, Ba, Zn, Ln, Bi, Ak, Fe, V, Nb, Ta, Mo, W, Ti, Zr, Zr, Hf, Sn, Ge, Si, Ta, e.g. $TaO_xN_y$ (see EP 1 160 833 for examples of such metal oxynitride based pigments); and organic pigments, such as yellow diaryl (PY83), yellow isoindolinone (PY 110-Cromophtal yellow 3RT or Irgazin Yellow 2RLT), yellow azo-condensation (PY 93-Cromophtal yellow 3G), yellow isoindoline (PY 139, PY 185) orange isoindolinone (PO61-Cromophtal Orange 2G), perylene (PR 149-PV Fast Red, PR 179, PR 224, PV 29), anthraquinone (PR 177-Irgazin Red A2BN), quinacridone (PR 122 or/and PV19), Ni-isoindoline (PR 257), thioindigo (PR 88), perinone (PR54), diketo-pyrrole (PR 254, PR272, PR264), copper phthalocyanines (PB 15, PB 16, PG 7, PG 36), red azo-condensation (PR 221, PR166), Lake Red C (Ba) (PR53:1), bon arylamide (PR2).

For example, $Fe_2O_3$, perylenes (PR 149-PV Fast Red) and anthraquinone (PR 177-Irgazin Red A2BN) are particularly suitable for absorption of blue light.

The pigments could be used alone or in combinations of two or more different pigments. The selection of the pigments will be done taking into consideration their resistance to temperature load and UV/blue light.

In general terms, the pigment compound should have a high absorption coefficient for pump-light and a low absorption coefficient (high transmittance) for the converted light.

Typically, the pigment compound is present in the matrix as particles having a mean primary particle size of nano-scale order, for example smaller than 1 μm in diameter, such as smaller than 500 nm in diameter, typically smaller than 250 nm in diameter. For weakly scattering particles, the diameter is preferably less than about 200 nm. For transparent particles, the diameter is preferably less than about 100 nm.

The matrix in which the pigment compound is distributed is a matrix comprising silicon and oxygen atoms wherein at least a portion of the silicon atoms are directly bonded to a hydrocarbon group.

Typically, at least 10%, such as at least 50%, for example more than 95% of the silicon atoms in the matrix are directly bonded to a hydrocarbon group.

For the purpose of the present invention, the term "silicon atom directly bonded to an organic group", relates to a silicon atom bonded to an organic group via a Si—C-bond. Hence, a methoxy group is not "an organic group directly bonded to a silicon atom", since the methoxy group is bonded to the silicon atom via a Si—O-bond.

Typically, the matrix has the overall chemical formula $Si-R^1_x-O_{2-x/2}$, where x is below 1, typically in the range of 0.1 to 0.95.

Such a silicon-oxygen matrix is typically obtained by at least partly hydrolyzing a composition comprising organically modified silane of the general formula $R^1-Si(OR^2)(OR^3)(OR^4)$, optionally further comprising silane of the general formula Si(OR') as will be described below.

In the above chemical formula, $R^1$ corresponds to an alkyl group, such as an straight or branched $C_{1-8}$-alkyl group, for example methyl, ethyl, propyl, n-butyl, t-butyl, i-butyl, pentyl, etc, or an aryl group, such as for example a phenyl-group.

Such a matrix may for example be prepared via a sol-gel process by polymerizing (hydrolyzing and condensing) an organically modified silane of the general formula $R^1-Si(OR^2)(OR^3)(OR^4)$, optionally in a mixture with a silane of the general formula $Si(OR')_4$.

$R^1$ is as defined above.

$R^2$, $R^3$ and $R^4$ may independently be any alkyl, such as straight and branched $C_{1-8}$-alkyls, for example methyl, ethyl, propyl, etc.

Examples of $R^1$-trialkoxysilanes suitable for use in the present invention include, but are not limited to, methyltrimethoxysilane (MTMS), methyltriethoxysilane (MTES), ethyltrimethoxysilane (ETMS), ethyltriethoxysilane (ETES), phenyltrimethoxysilane (PTMS) and phenyltriethoxysilane (PTES).

In silanes of the general formula $Si(OR')_4$ suitable for the present invention, R' is typically for each occurrence independently selected from among, but are not limited to hydrocarbon groups, such as straight and branched $C_{1-8}$-alkyls, for example methyl, ethyl, propyl, etc. Examples of such silanes include tetramethoxysilane (TMOS) and tetraethoxysilane (TEOS).

The ratio between $Si(OR^2)(OR^3)(OR^4)$ and $Si(OR')_4$ in the reaction mixture is typically in the range of from 1:9 to 10:0, typically up to 95:5.

One method for manufacturing the matrix is described below. As will be appreciated by those skilled in the art, variants of this method, using different reagents and/or reaction conditions, may be used to obtain a filter of the present invention.

A hydrolysis mixture is prepared by dissolving the organosilanes (for example MTMS and optionally TEOS) in a solvent therefore. The hydrolysis mixture typically further comprises a catalyst and/or reaction initiator. Typical catalyst and/or reaction initiator are for example, but are not limited to, water and acetic acid. During the reaction, the organosilanes are hydrolyzed. The hydrolyzation reaction leads to the replacement of the available (OR) groups by —OH groups.

The pigment compound(s) is added to the hydrolyzed mixture as a dispersion, for example a dispersion in $H_2O$:ethanol, optionally containing a dispersion agent, to form a coating composition.

The coating composition is deposited on a substrate (for example, the surface of a phosphor layer on a light-emitting diode, or the surface of an optical element, such as a lens), and a condensation reaction is initiated. During the condensation reaction, adjacent Si—OH groups forms Si—O—Si bridges via condensation of $H_2O$.

Depending on the reagents and reaction initiators, the condensation reaction may be initiated in different ways, such as by means of heat, UV-radiation, addition of a reactive compound, etc. A preferred condensation mechanism is heat.

Optionally, remaining solvents are typically removed by evaporation.

A matrix obtained by this method may become rather thin. In order to obtain a matrix with larger thickness, it is possible to add particles (filler materials) to the reaction mixture. Filler can be transparent or slightly scattering materials such as $SiO_2$, $Al_2O_3$, or other suitable materials. These fillers can be scattering with a mean primary particle size inferior to 1 µm, down to <100 nm, even <50 nm for non-scattering particles.

For example, $SiO_2$ can reduce the shrinkage of the layer during the manufacture. Typically, silica particles having a diameter of less than about 100 nm, such as less than about 50 nm may be used to increase the thickness of the matrix layer. One example of a filler material is LUDOX™, which is used to increase the thickness and decrease the stress in a thick film.

Useful additives can be added to the reaction mixture, such as additional solvents, wetting agent, anti-sedimentation, anti-sagging, rheology-modifiers (as thickeners or thinners), etc. This list of possible additives is non-exhaustive and well known from coating developers.

Due to that at least part of the silicon atoms coordinates 3 oxygen atoms and 1 hydrocarbon group, the obtained matrix is a quite flexible structure, having a low elasticity module. As a comparison, a matrix where essentially each silicon atom coordinates 4 oxygen atoms, such as a matrix obtained by polymerization (hydrolyzation and condensation) of tetraethoxysilane (TEOS) is much more rigid, having a higher elasticity module of 73 GPa.

Due to the relatively flexible nature of the matrix of the present invention, this matrix has a higher strength with regards to thermal expansion of the substrate on which the matrix is arranged. Thus, the matrix of the present invention can withstand higher temperature changes of the substrate than for example a TEOS-based matrix.

Another benefit of the flexibility of such a matrix is the possibility to insert large quantities of pigments in reasonable filter layer thicknesses of from 1 to 4 microns, and up to 20 microns if additional fillers are added.

These organically modified silanes provides layers, which are transparent, temperature stable at normal junction temperature of the high power LEDs and UV-blue resistant.

In the present invention, a luminescent material (phosphor) layer is typically arranged on a LED. The filter material is arranged on top of the luminescent layer and therefore might benefit from the use of a similar matrix material, because bonding performance is improved.

In operation, LEDs dissipate heat, which leads to thermal expansion of the light-emitting surface that in many cases are made of sapphire. With a non-flexible material arranged on the light-emitting surface, this material would be prone to crack, break or peel from the surface, but with a flexible material such as the matrix of the present invention, these detrimental events are much less probable to occur.

The pigment compound is homogeneously distributed in the matrix. The concentration of the pigment compound depends on the nature of the pigment compound(s) used, the thickness of the filter, the thickness of the phosphor layer and consequently of the amount of UV and blue light to cut off, etc, and is typically in the range of from 1 to 65% (vol) based on the dry final filter layer (i.e. after evaporation of any solvents etc).

As mentioned above, this type of matrix is also suitable as matrix for the luminescent layer, in addition to the filter layer.

One advantage of using a matrix of the present type, besides the above described flexibility, is that the matrix will have a low specific surface area compared to for example a TEOS-based matrix, which gives a high specific surface area. A high specific surface area gives a high area on which impurities, such as water and silicone compounds may absorb. Thus, the matrix material of the present invention is advantageous.

Light-emitting devices of the present invention may for example be used in lighting systems where a high control of the color point of the emitted light and a high stability is required, especially over large temperature ranges.

For example, light-emitting devices of the present invention may be used in signaling lights, such as break lights of vehicles, traffic lights etc. The devices may also be useful in other types of lighting applications, such as general lighting, in backlights for liquid crystal displays, as primary color sources in LED-based display devices, etc.

EXPERIMENTS

Experiment 1

Preparation of Filter Material (Example 1 of Filter Layer)

A first pigment dispersion was prepared by dispersing 10 g ZnFe$_2$O$_4$, particle size 40-70 nm in a 50:50 water:ethanol mixture, using Disperbyk 190 as dispersing agent.

A second pigment dispersion was prepared dispersing 3 g of Fe$_2$O$_3$, particle size 35-40 nm in a 50:50 water:ethanol mixture, using Disperbyk 190 as dispersing agent.

A hydrolysis mixture was prepared by mixing 40 g of MTMS, 0.6 g of TEOS, 32 g water, 4 g of ethanol and 0.15 g of glacial acetic acid. The hydrolyzed MTMS solution was then left for 48 h at room temperature.

A coating liquid was prepared by mixing 10 g of said ZnFe$_2$O$_4$ dispersion with 6 g of Fe$_2$O$_3$ dispersion and 10 g of MTMS/TEOS hydrolysis mixture with 4 g of methoxy propanol.

This coating liquid was deposited on a glass substrate suitable for transmission measurements to coat, and was then cured for 10 minutes at 250° C. This was done on a glass substrate for transmission measurements.

The resulting light absorbing coating had a thickness up to 2.7 micrometer. It was amber colored, transparent and free of scattering. Its color point in the CIE 1931 was (x=0.589, y=0.405) with an overall transmission of 52%.

Experiment 2

Preparation of Filter Material (Example 2 of Filter Material)

A pigment dispersion was prepared dispersing 3 g of Fe$_2$O$_3$ (particle size 35-40 nm) in a 50:50 water:ethanol mixture, using Disperbyk 190 as dispersing agent.

A hydrolysis mixture was prepared by mixing 40 g of MTMS, 0.6 g of TEOS, 32 g water, 4 g of ethanol and 0.15 g of glacial acetic acid. The hydrolyzed MTMS solution was then stored for 48 h at room temperature.

A coating liquid was prepared by mixing 20 g of the Fe$_2$O$_3$ dispersion and 10 g of MTMS/TEOS hydrolysis mixture with 4 g of di-aceton-alcohol (DAA).

This coating liquid was deposited on a glass substrate surface to coat, and was then cured for 5 minutes at 250° C.

It was amber-colored, transparent and free of scattering. Measurement of the spectrum in function of the wavelength was done using a UV-visible spectrophotometer. Its color point was calculated in the CIE 1931 with respect to a D65 lamp and the color coordinates were (x=0.5504, y=0.4286).

Experiment 3

The Effect on Color-Point of Phosphor Thickness

Since reliable determination of the layer thickness of the phosphor was more easily performed for coatings on thin glass plates than on LEDs, a special assembly, shown in FIG. 4, was used to measure the layer thickness dependence of the colour point.

YAG:Ce (QUMK58UF-D1, Phosphor Technology Ltd.) with an average diameter (D$_{50}$) of 3 micrometer was dispersed in a HTF lacquer (Philips/Eques Coatings Oss) and sprayed on glass substrates. The layer thickness was measured with a Fischer ISOSCOPE® on reference metal plates, which were coated in the same run as the glass plates, and varied between 6 and 45 micrometers.

The LED (1 W blue LED) on a submount was surrounded by a tightly fitting aluminium mirror.

The thickness dependence on the light intensity and colorpoint was measured by placing the different glass-substrates (with different thickness of YAG:Ce) over the LED, one by one, and measuring the emission of the LED in an integrated sphere.

Figure 4A:
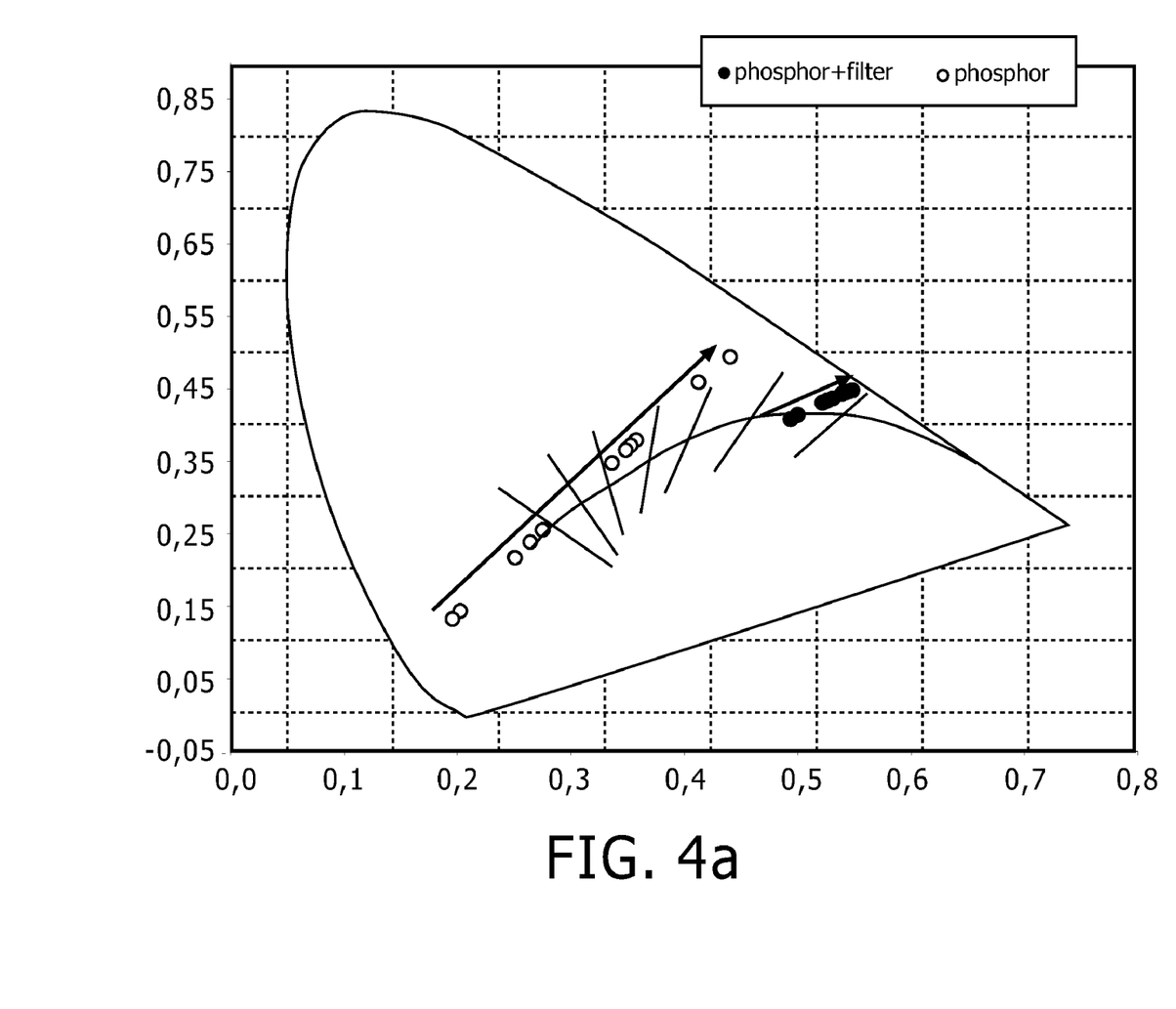
FIGS. 4a and b shows experimental results from one of the experiments described below.
Figure 4B:
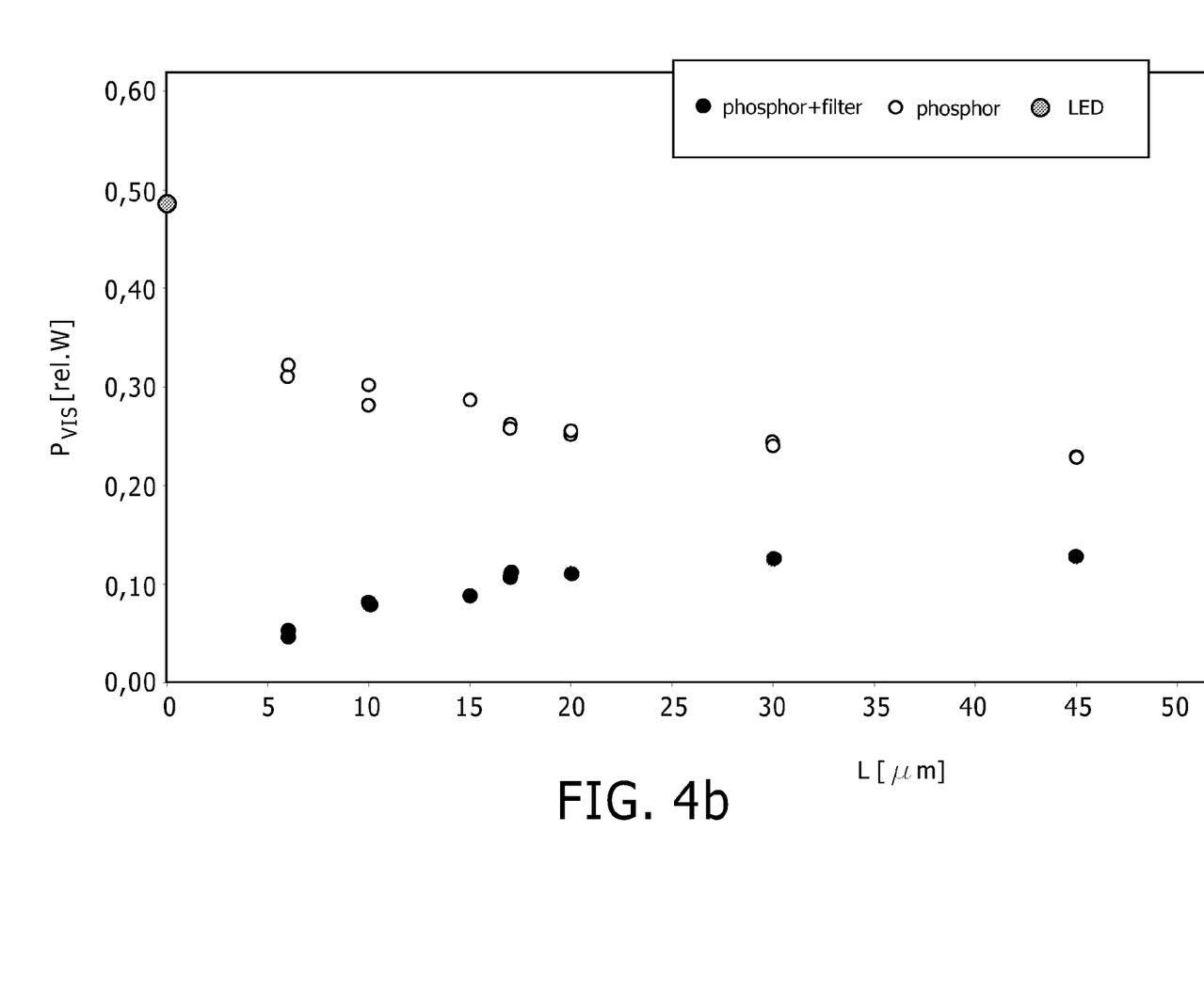

The data from this experiment is shown in FIG. 4a showing the color point as a function of the thickness in a CIE 1931-plot, and in FIG. 4b showing the intensity (visible power) as a function of the thickness.

FIG. 4a shows the color points for a LED (i) with phosphor layers of varying thicknesses but without filter (indicated by "phosphor"), and (ii) the same LED and phosphor combination as in (i), both with a filter layer as described in experiment 2 in addition to the phosphor layer (indicated by "phosphor+filter"). The thickness of the phosphor layer increases from 6 to 45 μm in the direction of the arrows.

Here, It is clearly seen that the color point vary a lot with the thickness for a device without any filter, whereas the color point vary much less with the thickness for a device with a filter of the present invention.

FIG. 4b shows (i) the measured intensity for a LED with a phosphor layer without any filter vs. the phosphor layer thickness (indicated by "phosphor"), (ii) the measured intensity for a LED with a filter layer as described in experiment 2 in addition to the phosphor layer vs. the phosphor layer thickness (indicated by "phosphor+filter"), and (iii) the measured intensity for the LED without any phosphor or filter layer (indicated by "LED").

Here, it is clearly seen that intensity for a device with phosphor, but without filter, decreases with thickness of the YAG:Ce-layer. On the other hand, for a device with a filter layer, the maximum intensity is reached at a phosphor thickness of about 30 μm. Together with the teachings of FIG. 4a, it is clear that even though the visible intensity is still affected by the YAG:Ce-thickness, the color point is much less affected when a filter layer of the present invention is used.

It is also clear from FIG. 4a that a high color saturation is possible even with a thin layer of luminescent material.

The invention claimed is:

1. A light-emitting device, comprising at least one light-emitting diode for emitting light of a first color and a luminescent material arranged on said at least one light-emitting diode to receive at least part of the light emitted by said light-emitting diode,
    characterized in that said light-emitting device further comprises a filter arranged to receive light emitted by said light-emitting diode and transmitted through said luminescent material and to absorb light of said first color; and
    said filter comprises a pigment compound distributed in a matrix of silicon and oxygen atoms, in which matrix at least a portion of said silicon atoms are directly bonded to hydrocarbon groups
    wherein at least part of the silicon atoms are bridged to another silicon atom via an oxygen atom forming bridged pairs and wherein at least part of the bridged pairs coordinates 3 oxygen atoms and 1 hydrocarbon atom with each of the bridged silicon atoms.

2. A light-emitting device according to claim 1, wherein at least 10% of said silicon atoms are directly bonded to hydrocarbon groups.

3. A light-emitting device according to claim 1, wherein at least 95% of said silicon atoms are directly bonded to hydrocarbon groups.

4. A light-emitting device according to claim 1, wherein said hydrocarbon groups are selected from among alkyls and aryls.

5. A light-emitting device according to claim 4, wherein said matrix is the result from polymerizing a composition comprising R1-trialkoxysilane, where R1 is selected from the group consisting of alkyl and aryls.

6. A light-emitting device according to claim 5, wherein R1 is selected from among methyl, ethyl, propyl and phenyl.

7. A light-emitting device according to claim 5, wherein said R1-trialkoxysilane is selected from the group consisting of R1-trimethoxysilane and R1-triethoxysilane.

8. A light-emitting device according to claim 4, wherein said composition further comprises tetraalkoxysilane.

9. A light-emitting device according to claim 1, wherein said pigment compound is essentially non-luminescent.

10. A light-emitting device according to claim 1, wherein said pigment compound is in the form of particles having a mean particle diameter of less than 250 nm.

11. A light-emitting device according to claim 1, wherein said pigment compound is selected from the group consisting of noble metal colloid particles, inorganic pigments, organic pigments, and any combinations of two or more thereof.

12. A light-emitting device according to claim 1, wherein said filter further comprises filler material particles.

13. A light-emitting device according to claim 1, wherein said filter is arranged on top of said luminescent material.

14. A light-emitting device according to claim 1, further comprising an optical element arranged to receive light emitted by said light-emitting diode, wherein said filter is arranged on said optical element.

15. A light-emitting device according to claim 1, wherein said first color is UV or blue.

16. A light-emitting device according to claim 1, wherein said luminescent material absorbs light of said first color and emits green, amber or red light.

17. A method for the manufacture of a light-emitting device, comprising:
providing at least one light-emitting diode for emitting light of a first color, on which light-emitting diode a luminescent material is arranged to receive at least part of the light emitted by said light-emitting diode;
arranging, on said luminescent material, a filter by arranging and polymerizing a polymerizable composition on said luminescent material, which polymerizable composition comprises at least an organically modified silane having the general formula R1-trialkoxysilane and a pigment compound in a liquid medium, wherein R1 is selected from the group consisting of aryls and alkyls,
wherein at least part of the silicon atoms are bridged to another silicon atom via an oxygen atom forming bridged pairs and wherein at least part of the bridged pairs coordinates 3 oxygen atoms and 1 hydrocarbon atom with each of the bridged silicon atoms, and wherein said pigment compound absorbs light of said first color.

18. A method according to claim 17, wherein said filter further comprises filler material particles.

19. A method for the manufacture of a light-emitting device, comprising:
providing at least one light-emitting diode for emitting light of a first color, on which light-emitting diode a luminescent material is arranged to receive at least part of the light emitted by said light-emitting diode;
providing an optical element;
arranging, on said optical element, a filter by arranging and polymerizing a composition on said optical element, which composition comprises at least an organically modified silane having the general formula R1-trialkoxysilane and a pigment compound in a liquid medium,
wherein at least part of the silicon atoms are bridged to another silicon atom via an oxygen atom forming bridged pairs and wherein at least part of the bridged pairs coordinates 3 oxygen atoms and 1 hydrocarbon atom with each of the bridged silicon atoms, wherein R1 is selected from the group consisting of aryls and alkyls, and wherein said pigment compound absorbs light of said first color; and
arranging said optical element such that said filter receives light emitted by said light-emitting diode and transmitted through said luminescent material.

20. A method according to claim 17, wherein said composition further comprises a tetraalkoxysilane, where the molar ratio R1-trialkoxysilane:tetraalkoxysilane is in the range of from 1:9 to 10:0.

21. A method according to claim 17, wherein said R1-trialkoxysilane is selected from the group consisting of methyl-, ethyl-, propyl and phenyl-trimethoxysilane and -triethoxysilane, and any combination of two or more thereof.

22. A method according to claim 17, wherein said pigment compound is essentially non-luminescent.

23. A method according to claim 17, wherein said pigment compound is in the form of particles having a mean particle diameter of less than 250 nm.

24. A method according to claim 17, wherein said pigment compound is selected from the group consisting of noble metal colloid particles, inorganic pigments, organic pigments, and any combinations of two or more thereof.

* * * * *